United States Patent
Cowan et al.

(10) Patent No.: US 6,299,526 B1
(45) Date of Patent: Oct. 9, 2001

(54) TEMPERATURE SYSTEM FOR ENCLOSURE

(75) Inventors: Douglas L. Cowan, Norcross, GA (US); Anthony Joseph David, Omaha, NE (US); Jason A. Kay, Morristown; David Stevens Kerr, Morris Plains, both of NJ (US); Ivan Pawlenko, Holland, PA (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/417,666

(22) Filed: Oct. 14, 1999

(51) Int. Cl.⁷ .............................. H05K 5/00; F24F 13/08
(52) U.S. Cl. .................. 454/184; 165/80.3; 361/691; 454/341
(58) Field of Search ................ 236/DIG. 19; 454/339, 454/341, 902, 184; 62/259.2; 165/80.3; 361/678, 691

(56) References Cited

U.S. PATENT DOCUMENTS

| | | |
|---|---|---|
| 4,594,940 | 6/1986 | Wolbrink et al. . |
| 5,311,746 * | 5/1994 | Dombrowski et al. ....... 236/DIG. 19 |
| 5,363,440 | 11/1994 | Daoud .................................. 379/399 |
| 5,369,548 | 11/1994 | Combs ................................. 361/643 |
| 5,497,416 | 3/1996 | Butler, III et al. ................... 379/399 |
| 5,508,873 | 4/1996 | Knapp et al. ......................... 361/119 |
| 5,515,435 | 5/1996 | DeBalko et al. ..................... 379/399 |
| 5,521,963 | 5/1996 | Shrader et al. ........................ 379/60 |
| 5,528,684 | 6/1996 | Schneider et al. ................... 379/399 |
| 5,703,944 | 12/1997 | DeBalko ............................... 379/399 |
| 5,754,643 | 5/1998 | Decker et al. ....................... 379/399 |
| 5,809,936 * | 9/1998 | Wall .................................... 454/200 |

* cited by examiner

*Primary Examiner*—William Wayner
(74) *Attorney, Agent, or Firm*—Dickstein Shapiro Morin & Oshinsky LLP

(57) ABSTRACT

A system for stabilizing, moderating and/or controlling the temperature of an outdoor enclosure, such as a network interface device, using room-temperature air from the associated building. A fan draws the room temperature (or moderate-temperature) air through a conduit from the interior of the dwelling to the outdoor enclosure. The outdoor enclosure is temperature-stabilized as indoor air flows through it. The air may flow through the same conduit that accommodates the data lines. A power line for the fan may be located in the same conduit. The system may be arranged to prevent insects and contaminants from entering the enclosure.

19 Claims, 1 Drawing Sheet

TEMPERATURE SYSTEM FOR ENCLOSURE

FIELD OF THE INVENTION

The present invention relates to systems for controlling or modifying the temperature of telecommunications and/or electronic network devices and enclosures. More particularly, the present invention relates to a method and apparatus for stabilizing the temperature of network interface devices (NIDs). The present invention also relates to a system for using indoor ambient-temperature air to stabilize the temperature in an outdoor enclosure.

BACKGROUND OF THE INVENTION

Certain consumers may receive telecommunications, cable television, and other media from separate suppliers. The signals are provided to each customer via coaxial cables and tip and ring wires connected to an outdoor enclosure known as a network interface device (NID). A network interface device may be attached to the exterior wall of the customer's house or garage, for example. Such devices provide a physical interface or point of access for testing, maintenance, service enhancement or modification, safety and the like.

Network interface devices may be mounted outdoors in unsheltered locations where access by the service provider is readily available. Therefore, such devices are subject to environmental weathering conditions which can be severe. Enclosures for such devices may be fabricated from polymeric materials to accommodate the need for high volume manufacturing and low cost. However, extremes of temperature and other factors can cause degradation of the polymers and thereby shorten the useful life of the enclosure and/or the devices located therein. Additionally, numerous cables entering the network interface device, as well as the active electronics inside, may produce a significant amount of heat. The same components that create heat are themselves sometimes heat sensitive, and therefore, some form of temperature stabilization is desirable.

Currently, outdoor enclosures that use active cooling are large and electrically or battery powered. The cooling is generally provided by an air-conditioning unit similar in architecture to a residential air conditioning unit. There is a need in the art for an inexpensive, low maintenance system for actively controlling the temperature of a network interface device.

SUMMARY OF THE INVENTION

The present invention relates to a system for controlling the temperature of an outdoor enclosure or device. According to one aspect of the invention, a fan draws air from indoors, passes it through the outdoor enclosure, and discharges it out of the box through an opening. Temperature stabilization with the ambient indoor temperature is thus provided to the outdoor enclosure. In the summer, when the indoor temperature is cooler than outdoors, cooler air from inside the dwelling chills the components in the outdoor enclosure (and the enclosure itself). Conversely, during the winter months, warm air from indoors heats the enclosed components.

According to one aspect of the invention, the fan is powered by an electrical source located in the dwelling. The source may be arranged so that it does not exceed forty volts direct current (V DC). If the preferred voltage is exceeded, a licensed electrician may be required to install the fan, which would increase the cost and time associated with installing the enclosure.

In a preferred embodiment of the invention, the fan causes temperature-controlled air to flow through a conduit formed in the building exterior wall. The same conduit may also contain communications and electrical wires for the network interface device. Thus, the same conduit that carries the data wires can also be used to transport the temperate indoor air.

After passing through the outdoor enclosure, the ambient indoor air exits through one or more openings formed in the outdoor enclosure. The opening(s) may be sized to prevent dust, rain and other particles and debris from entering the outdoor enclosure. In addition, the ambient air rushing out of the enclosure through the opening(s) may prevent or discourage insects from entering the enclosure.

Insects may pose a significant risk to the components and wiring housed within the enclosure. If insects were allowed to nest within the enclosure, they could potentially destroy fragile wiring and sensitive components. It is further undesirable to have insects in the enclosure because they could enter the adjacent structure and pose sanitary, health or aesthetic problems. Because the enclosure provides a shelter from the natural elements, along with a temperate environment, insects might want to enter the enclosure. Use of a small opening (or openings) by which air leaves the box addresses the insect problem. Air current is directed out of the enclosure through the small opening(s). The steady flow of escaping air creates an environment that is hostile to insects and discourages them from nesting within the enclosure.

An object of the invention is to provide a simple, inexpensive, and easy to maintain temperature control mechanism for a network interface device and/or other enclosures.

DETAILED DESCRIPTION OF PREFERRED EMBODIMENTS

Figure 1:
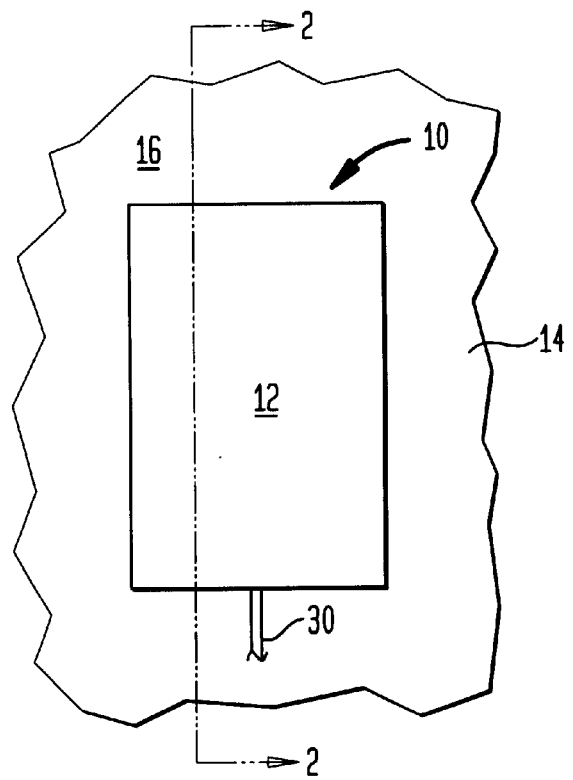
FIG. 1 is a front view of a network interface device constructed according to a preferred embodiment of the present invention, attached to a residential building.
Figure 2:
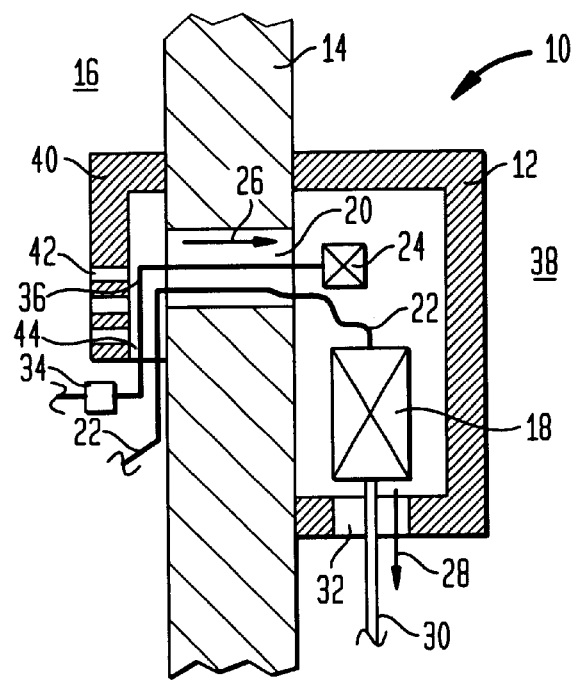
FIG. 2 is a cross-sectional view taken along the line 2—2 of FIG. 1.

Referring now to the drawings, where like reference numerals designate like elements, there is shown in FIG. 1 a network interface device 10 constructed in accordance with a preferred embodiment of the present invention. The network interface device 10 includes an enclosure 12 attached to the exterior wall 14 of a building 16. Electronic devices 18 (FIG. 2) are located within the enclosure 12. An opening 20 is formed through the wall 14 to accommodate data wires 22 from the electronic devices 18. A fan 24 draws air from the building 16 and forces the air through the enclosure 12 in the direction of arrow 26, 28. The air 26, 28 moderates the temperature within the enclosure 12. During the summer, the air 26, 28 cools the enclosure 12. During the winter, the air 26, 28 warms the enclosure 12.

The enclosure 12 may be formed of inexpensive plastic or another suitable material. Since the temperature of the enclosure 12 is moderated by the fan 24, the enclosure 12 need not be so durable to extreme weather temperatures as would otherwise be the case. The enclosure 12 may be clipped or bolted to the wall 14 by a suitable connection mechanism (not shown).

The building 16 may be a residential dwelling, such as a single family home, or it could be an apartment building, a townhouse structure, or the like. The building 16 may also be a garage. The invention is applicable to a wide variety of structures that contain temperate air moderated from the extremes of outdoors weather. The wall (or foundation) 14 may be formed of a variety of construction materials.

The electronic devices 18, which may include temperature-sensitive components, may be connected to suitable communications and/or power cables 30 as is known in the art. The cables 30 pass through one or more suitable openings 32. The opening(s) 32 may be sized relative to the fan 24 such that air rushes through the opening(s) 32 to prevent or discourage insects, dust and the like from entering the enclosure 12.

The fan 24 may be designed to operate at 40 V DC or less. A suitable transformer 34 may be provided for transforming the 110 V alternating current power available in the building 16 to the desired low electrical power for operating the fan 24. The transformer 34 may be connected to the fan 24 by a suitable power line 36. The power line 36 may pass through the same conduit 20 as the data lines 22. This way, only one small conduit 20 has to be formed in the wall 14. The transformer 34 should preferably be located inside the dwelling 16. This way, the network interface device 10 may be installed by someone other than an electrician, depending on the applicable regulations. The use of a single conduit 20 for cables and heat exchange into the enclosure 12 reduces installation time and cost when compared to drilling separate holes through the wall 14.

In a preferred embodiment of the invention, the fan 24 may be operated continuously. The fan 24 may be designed to flow sufficient ambient temperature air through the enclosure 12 to maintain the temperature of the enclosure 12 within a relatively narrow range, despite extreme weather temperatures experienced outdoors 38. In an alternative embodiment of the invention, a thermostat (not illustrated) may be used such that the fan 24 operates only when the temperature within the enclosure 12 is outside a predetermined range. In addition, a signal device, such as an indicator light (not illustrated), may be provided if desired to alert the operator of a malfunction with respect to the fan 24.

In a preferred embodiment of the invention, a louver or cover 40 may be located over the opening 20 inside the building 16. The cover 40 may have air openings (or a grill) 42 for flowing air from inside the building 16 to the enclosure 12. The cover 40 may also have a suitable opening 44 for accommodating the power line 36 and the data lines 22. The cover 40 may be formed in a wide variety of shapes and size; according to a variety of functional and aesthetic criteria. The present invention should not be limited to the specific structures aid instrumentalities shown in the drawings and described herein in detail. The cover 40 may be attached to the wall 14 by a suitable connection system (not shown). In a preferred embodiment, the cover 38 is placed above the floor of the dwelling 16 such that the air 26, 28 drawn through the enclosure 12 is of a temperature and humidity representative of air from inside the house 16.

The fan 24, conduit 20, and plastic enclosure 12 may be installed at separate times or all at once, where the entire unit is fixed into the wall 14. In either case, the fan 24 may be powered by a local source (such as a battery) or from a source inside the house 16 whereby the wires 36, 22 run through the same conduit 20.

The above description and the attached drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A system for controlling the temperature in a network interface device, said system comprising:

an outdoor enclosure for enclosing said network interface device, said outdoor enclosure having an opening, said outdoor enclosure being located on a wall of a building; and a fan for causing room temperature air to flow from said building, into said outdoor enclosure, and through said opening.

2. The system of claim 1, further comprising a conduit for flowing air into said enclosure.

3. The system of claim 1, wherein said outdoor enclosure includes plastic.

4. The system of claim 1, further comprising a power source for said fan.

5. A system for controlling the temperature in a network interface device, said system comprising:

an outdoor enclosure having an opening; and a fan for causing room temperature air flow into said outdoor enclosure and through said opening; and wherein said outdoor enclosure contains electronic devices and signal lines, said signal lines extending out of said enclosure through said opening.

6. The system of claim 5, wherein said opening is configured to prevent contaminants from entering said outdoor enclosure.

7. The system of claim 5, wherein said fain and said opening are sized to prevent insects from entering said outdoor enclosure.

8. A system for controlling the temperature in a network interface device, said system comprising:

an outdoor enclosure having an opening;

a fan for causing room temperature air to flow into said outdoor enclosure and through said opening; and a power source for said fan, and wherein said power source supplies direct current to said fan at no more than about forty volts.

9. The system of claim 8, further comprising a power line located between said power source and said fan, said power line being located in said conduit.

10. The system of claim 9, further comprising data lines located in said conduit, said data lines being connected to electronic components.

11. The system of claim 10, further comprising a cover located within a dwelling, said cover having one or more opening for said air, said power line and said data lines.

12. A method of operating an outdoor enclosure attached to a building, said method comprising the steps of:

causing room temperature air to flow from the interior of said building, into said outdoor enclosure, and then through an opening in said outdoor enclosure; and communicating signals through data lines from said outdoor enclosure and into said interior of said building.

13. The method of claim 12, wherein said step of causing air to flow includes the step of operating a fan located within said enclosure.

14. The method of claim 12, wherein said building includes a residential dwelling.

15. The method of claim 12, wherein said step of causing air to flow into said enclosure includes the step of flowing air through a conduit formed in a wall of said building.

16. The method of claim 15, wherein said data lines are located in said conduit.

17. The method of claim 16, wherein said air flowing through said conduit is cooler than the outdoors temperature.

18. The method of claim 17, wherein said step of flowing air through said opening includes the step of preventing insects from entering said enclosure.

19. The method of claim 16, wherein said air flowing through said conduit is warmer than the outdoors temperature.

* * * * *